US008681518B2

(12) United States Patent
Callanan et al.

(10) Patent No.: US 8,681,518 B2
(45) Date of Patent: Mar. 25, 2014

(54) HIGH SPEED RECTIFIER CIRCUIT

(75) Inventors: Robert Callanan, Raleigh, NC (US); Fatima Husna, Morrisville, NC (US)

(73) Assignee: Cree, Inc., Durham, NC (US)

( * ) Notice: Subject to any disclaimer, the term of this patent is extended or adjusted under 35 U.S.C. 154(b) by 194 days.

(21) Appl. No.: 12/506,610

(22) Filed: Jul. 21, 2009

(65) Prior Publication Data

US 2011/0019450 A1 Jan. 27, 2011

(51) Int. Cl.
*H02H 7/125* (2006.01)

(52) U.S. Cl.
USPC ............................................................ 363/53

(58) Field of Classification Search
USPC .................................. 363/52, 53, 125, 127
See application file for complete search history.

(56) References Cited

U.S. PATENT DOCUMENTS

| 4,868,424 | A | * | 9/1989 | Bosnyak et al. ............... 326/89 |
| 6,434,019 | B2 | * | 8/2002 | Baudelot et al. ............... 363/16 |
| 7,402,845 | B2 | * | 7/2008 | Cheah et al. ................. 257/192 |
| 2007/0176291 | A1 | | 8/2007 | Cheah et al. |
| 2008/0122418 | A1 | | 5/2008 | Briere et al. |

FOREIGN PATENT DOCUMENTS

| JP | 2008-501238 A | 1/2007 |
| JP | 2008-198735 A | 8/2008 |
| JP | 2009-182107 A | 8/2009 |

OTHER PUBLICATIONS

High transconductance enhancement-mode AlGAN/GaN HEMTs on SiC substrate. V. Kumar et al. Electronics Letters vol. 39 No. 24 Nov. 27, 2003.*
Invitation to Pay Additional Fees corresponding to International Application No. PCT/US2010/035057; Date of Mailing: Mar. 28, 2011; 8 pages.
Khemka, "*HMS Rectifier*: A Novel Hybrid MOS Schottky Diode Concept with No Barrier Lowering, Low Leakage Current and High Breakdown Voltage", IEEE Proceedings of the 17th International Symposium on Power Semiconductor Devices & IC's, May 23-26, 2005, Santa Barbara, CA; pp. 1-4, nXP10820688.
International Search Report and The Written Opinion of The International Searching Authority Corresponding to International Application No. PCT/US2010/035057; Date of Mailing: Jun. 21, 2011; 15 Pages.
International Preliminary Report on Patentability Corresponding to International Application No. PCT/US2010/035057; Date of Mailing: Feb. 2, 2012; 9 pages.
Japanese Office Action Corresponding to Japanese Patent Application No. 2012-521635; Date Mailed: Feb. 7, 2013, 8 Pages.

* cited by examiner

*Primary Examiner* — Adolf Berhane
(74) *Attorney, Agent, or Firm* — Myers Bigel Sibley & Sajovec P.A.

(57) ABSTRACT

Provided is a rectifier circuit that includes a depletion mode semiconductor having an output connected to a rectified signal output node of the rectifier circuit and a hot carrier semiconductor diode having a cathode connected to a source node of the depletion mode semiconductor and an anode connected to a gate node of the depletion mode semiconductor. The rectifier may include an alternating current (AC) input node that is connected to the anode of the hot carrier semiconductor diode and the gate node of the depletion mode semiconductor and that is configured to receive an AC input signal.

16 Claims, 3 Drawing Sheets

US 8,681,518 B2

HIGH SPEED RECTIFIER CIRCUIT

STATEMENT OF U.S. GOVERNMENT INTEREST

This invention was made with Government support under Office of Naval Research Contract No. 05-C-0226. The Government has certain rights in the invention.

FIELD OF THE INVENTION

The present invention relates to power conversion and, more particularly, to rectifier circuits that convert alternating current into direct current.

BACKGROUND

Rectifier circuits convert alternating-current (AC) into direct-current (DC). For example, some rectifier circuits include a diode circuit that is configured to function as a rectifying element by conducting alternating half-cycles of an AC input signal. Such rectifiers may be limited in switching speed by total capacitance therein. The efficiency of such rectifier circuits can be limited by the threshold forward voltage (about 0.3 V) for the rectifier circuits to become conductive. For high current applications, the threshold forward voltages of the diodes may result in an unacceptable heat generation.

SUMMARY

In some embodiments of the present invention, a rectifier circuit may include a depletion mode semiconductor having an output connected to a rectified signal output node of the rectifier circuit, a hot carrier semiconductor diode having a cathode connected to a source node of the depletion mode semiconductor and an anode connected to a gate node of the depletion mode semiconductor and an alternating current (AC) input node that is connected to the anode of the hot carrier semiconductor diode and the gate node of the depletion mode semiconductor and that is configured to receive an AC input signal.

Some embodiments provide that, responsive to a first half cycle of the AC input signal, the hot carrier semiconductor diode is forward biased to cause an applied voltage at the source node of the depletion mode semiconductor and an applied voltage at the gate node of the depletion mode semiconductor to be slightly different, which forward biases the depletion mode semiconductor. In some embodiments, responsive to a second half cycle of the AC input signal, the hot carrier semiconductor diode is reverse biased to cause the source node of the depletion mode semiconductor to float relative to the gate node of the depletion mode semiconductor, which reverse biases the depletion mode semiconductor to cause the depletion mode semiconductor to generate a rectified output signal through the rectified signal output node during at least the first half cycle of the AC input signal.

Some embodiments provide that the hot carrier semiconductor diode includes a Schottky diode. Some embodiments provide that the hot carrier semiconductor diode includes a silicon Schottky diode.

In some embodiments, the depletion mode semiconductor includes a high electron mobility transistor (HEMT) that incorporates at least one heterojunction as a conducting channel. Some embodiments provide that the depletion mode semiconductor includes a GaN high electron mobility transistor (HEMT) circuit.

In some embodiments, the hot carrier semiconductor diode includes a silicon Schottky diode, the depletion mode semiconductor includes a GaN high electron mobility transistor (HEMT), and when a first half cycle of the AC input signal is applied to the AC input node, a voltage drop between the AC input node and the rectified signal output node includes a sum of a Schottky diode forward biased voltage drop and a voltage drop due to a source to drain resistance of the GaN HEMT.

Some embodiments of the present invention include a reverse conducting cascode switch that includes a depletion mode semiconductor having a drain node connected to a drain node of the switch, a hot carrier semiconductor diode having a cathode connected to a source input of the depletion mode semiconductor and an anode connected to a gate node of the depletion mode semiconductor and to a source node of the switch, and a reversing transistor operable to selectively provide a conductive connection between the source node of the depletion mode semiconductor and the gate node of the depletion mode semiconductor responsive to a switching signal received at the reversing transistor. In some embodiments, the reverse conducting cascode switch includes a source node that is connected to the anode of the hot carrier semiconductor diode, the gate node of the depletion mode semiconductor and an output terminal of the reversing transistor.

Some embodiments provide that, responsive to a first half cycle of the AC input signal, the hot carrier semiconductor diode is forward biased to cause an applied voltage at the source node of the depletion mode semiconductor and an applied voltage at the gate node of the depletion mode semiconductor to be slightly different, which saturates the depletion mode semiconductor. In some embodiments, wherein responsive to a second half cycle of the AC input signal and the switching signal received at the reversing transistor, the reversing transistor saturates to cause an applied voltage at the source node of the depletion mode semiconductor and an applied voltage at the gate node of the depletion mode semiconductor to be slightly different, which saturates the depletion mode semiconductor and allows reverse conduction from the drain node of the switch to the source node of the switch via the reversing transistor.

Some embodiments provide that the hot carrier semiconductor diode includes a Schottky diode. In some embodiments, the hot carrier semiconductor diode includes a silicon Schottky diode.

Some embodiments provide that the depletion mode semiconductor includes a high electron mobility transistor (HEMT) that incorporates at least one heterojunction as a conducting channel. In some embodiments, the depletion mode semiconductor includes a GaN high electron mobility transistor (HEMT).

Some embodiments provide that the hot carrier semiconductor diode includes a silicon Schottky diode, the depletion mode semiconductor includes a GaN high electron mobility transistor (HEMT), and when a first half cycle of the AC input signal is applied to the AC input node, a voltage drop between the AC input node and the rectified signal output node includes a sum of a Schottky diode forward biased voltage drop and a voltage drop due to a source to drain resistance of the GaN HEMT.

In some embodiments, the reversing transistor includes a bipolar junction transistor with a collector terminal, a base terminal and an emitter terminal. Some embodiments provide that the collector terminal is connected to the source node of the depletion mode semiconductor, the emitter terminal is connected to the anode of the hot carrier semiconductor diode, and the base terminal is configured to receive the switching signal.

Some embodiments of the present invention include a high-voltage, low-capacitance rectifier circuit. The rectifier circuit of some embodiments includes a high-speed, high-voltage, normally-on field effect transistor (FET) connected to a rectified signal output node of the rectifier circuit and a high-speed, low-voltage diode having a cathode connected to a source node of the FET and an anode connected to both of a gate node of the FET and an alternating current (AC) input node that is operable to receive an AC input signal.

In some embodiments, wherein responsive to a first half cycle of the AC input signal, the diode is forward biased to cause an applied voltage at the source node of the FET and an applied voltage at the gate node of the FET to be slightly different, which causes the FET to saturate. Some embodiments provide that, responsive to a second half cycle of the AC input signal, the diode is reverse biased to cause the source node of the FET to float relative to the gate node of the FET, which reverse biases the FET to cause the FET to generate a rectified output signal through the rectified signal output node during at least the first half cycle of the AC input signal.

In some embodiments, the diode includes a Schottky diode. Some embodiments provide that the diode includes a silicon Schottky diode. In some embodiments, the FET includes a high electron mobility transistor (HEMT) that incorporates at least one heterojunction as a conducting channel. Some embodiments provide that the FET includes a GaN high electron mobility transistor (HEMT).

Some embodiments provide that the diode includes a silicon Schottky diode, the FET includes a GaN high electron mobility transistor (HEMT), and when a first half cycle of the AC input signal is applied to the AC input node, a voltage drop between the AC input node and the rectified signal output node includes a sum of a Schottky diode forward biased voltage drop and a voltage drop due to a source to drain resistance of the GaN HEMT.

BRIEF DESCRIPTION OF THE DRAWINGS

The accompanying drawings, which are included to provide a further understanding of the invention and are incorporated in and constitute a part of this application, illustrate certain embodiment(s) of the invention.

DETAILED DESCRIPTION OF EMBODIMENTS OF THE INVENTION

Figure 1:
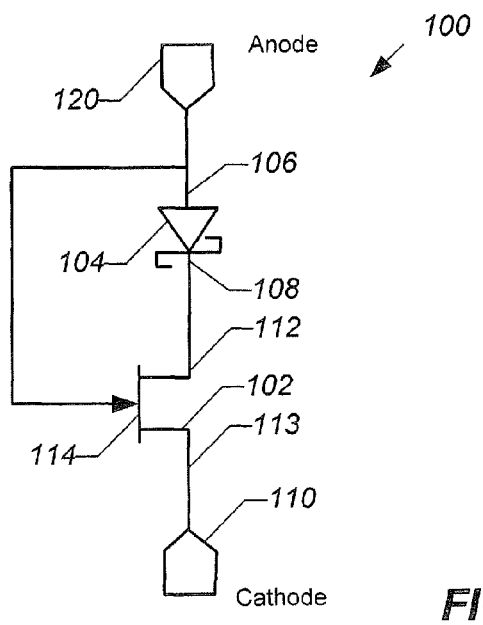
FIG. 1 is a schematic diagram of a rectifier circuit that uses a depletion mode semiconductor and a hot carrier semiconductor diode as rectifying elements in accordance with some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Some embodiments of the invention may be described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes.

Various embodiments of the present invention may arise from the present realization that high-voltage, high-speed rectifier circuits can benefit from low forward voltage drop characteristics, which may enable increased temperature operation relative to circuits experiencing higher voltage drops.

Reference is now made to FIG. 1, which is a schematic diagram of a rectifier circuit that uses a depletion mode semiconductor and a hot carrier semiconductor diode as rectifying elements in accordance with some embodiments of the present invention. The rectifier circuit 100 may include a rectifier anode 120 and a rectifier cathode 110, between which current may be allowed to flow in a first direction with low forward voltage drop characteristics and prevented from flowing in a second direction. In this manner, an alternating current (AC) input signal applied at, for example, the rectifier anode 120 may be delivered to the rectifier cathode 110 as a rectified signal output. The rectifier circuit 100 may include a depletion mode semiconductor 102 having an output connected to the cathode 110, which may be described as the rectified signal output node of the rectifier circuit.

In some embodiments, the depletion mode semiconductor 102 may include a high electron mobility transistor (HEMT) device. Some embodiments provide that the depletion mode semiconductor 102 may include any bidirectional conducting and forward blocking depletion mode device, such as, for example, a JFET using any semiconductor, a GaN HEMT, a SiC MESFET, and/or MOSFET in any semiconductor, among others. Some embodiments provide that the HEMT may include at least one heterojunction as a conducting channel. In some embodiments, the depletion mode semiconductor 102 may include GaN, AlGaAs, and/or GaAs, among others. Some embodiments provide that the depletion mode semiconductor 102 may include a source node 112, a gate node 114 and/or a drain node 113.

The rectifier circuit 100 may include a hot carrier semiconductor diode 104 that includes a cathode 108 and an anode 106. In some embodiments, a hot carrier diode may be characterized by a low forward voltage drop and a very fast switching action and may be referred to a majority carrier semiconductor. Some embodiments provide that the cathode 108 may be connected to a source node 112 of the depletion mode semiconductor 102 and the anode 106 may be connected to a gate node 114 of the depletion mode semiconductor 102. In some embodiments, the node defined by the connection between the gate node 114 of the depletion mode semiconductor 102 and the anode 106 of the hot carrier semiconductor diode 104 may be connected to the rectifier anode 120.

In some embodiments, the hot carrier semiconductor diode 104 may include a Schottky diode. Some embodiments provide that the hot carrier semiconductor 104 may include any low voltage, majority carrier high speed diode with low forward drop. For example, some embodiments include a Schottky, junction barrier Schottky (JBS) etc. in any semiconductor, such as, for example, Si, SiC GaN, GaAs, etc. For example, some exemplary embodiments provide that the hot carrier semiconductor diode 104 includes a silicon Schottky diode. In this regard, some embodiments provide that the rectifier circuit 100 includes a GaN HEMT and a silicon Schottky diode used in combination with one another. In this manner, a high-voltage high-speed rectifier with low forward voltage drop may be realized via a combination including a high-voltage high-speed normally-on field effect transistor and a low-voltage high-speed diode. In some embodiments, a rectifier circuit 100 as described herein may be referred to as a cascode rectifier.

In some embodiments, the hot carrier semiconductor diode 104 and the depletion mode transistor 102, as discussed above, may be integrated into a single device to form an on-chip device.

Some embodiments of the rectifier circuit 100 may operate as follows. First, consider the forward biased case where current flows from anode to cathode. In some embodiments, this may correspond to a first half cycle of an AC input signal being applied to the rectifier anode 120. As the voltage is greater on the anode 106 than the cathode 108, the hot carrier semiconductor diode 104 is forward biased and thus conductive with a small voltage drop. The conducted voltage (minus the small voltage drop) of the hot carrier semiconductor diode 104 is applied to the source node 112 of the depletion mode semiconductor 102. As the AC input signal is also applied to the gate node 114 of the depletion mode semiconductor 102, a slight forward bias of the depletion mode semiconductor 102 gate to source junction is realized.

Resulting from the forward bias of the depletion mode semiconductor gate to source junction, the depletion mode semiconductor 102 becomes conductive from the source node 112 to the drain node 113. Some embodiments provide that the resulting rectifier anode 120 to rectifier cathode 110 voltage drop may be the hot carrier semiconductor diode 104 voltage drop plus the voltage drop due to the source node 112 to drain node 113 resistance of the depletion mode semiconductor 102.

Now, consider the reverse biased case where current flows from the rectifier cathode 110 to the rectifier anode 120. In some embodiments, this may correspond to a second half cycle of an AC input signal being applied to the rectifier anode 120. Under static conditions, the hot carrier semiconductor diode 104 may be in a blocking or non-conducting state. In this regard, the voltage at the source node 112 of the depletion mode semiconductor 102 may be floating. When the gate to source voltage drops below a threshold voltage, the depletion mode semiconductor 102 may be in a blocking and/or non-conducting mode as a result of the gate to source junction of the depletion mode semiconductor becoming reverse biased.

When the depletion mode semiconductor 102 is in a non-conducting mode, the rectifier circuit 100 ceases to conduct. In some embodiments, the reverse voltage across the hot carrier semiconductor diode 104 may be limited to the threshold voltage of the depletion mode semiconductor 102. The resulting rectifier circuit 100 may thus possess the high voltage and low capacitance characteristics of a high-voltage depletion mode semiconductor 102 with the switching characteristics of a low-voltage high-speed hot carrier semiconductor diode 104. Some embodiments provide that the hot carrier semiconductor diode 104 need only sustain the threshold voltage of the depletion mode semiconductor. In this manner, the high speed characteristics of the depletion mode semiconductor 102 may be exploited to form a diode with low forward drop without having to resort to synchronous rectification.

Some embodiments provide that the depletion mode semiconductor 102 may include a field effect transistor (FET). For example, according to some embodiments of the present invention a high-voltage, low-capacitance rectifier circuit may be provided that includes a high-speed, high-voltage, normally-on FET 102 connected to a rectified signal output node of the rectifier circuit and a high-speed, low-voltage diode 104 having a cathode 108 connected to a source node 112 of the FET 102 and an anode 106 connected to a gate node 114 of the FET 102. In some embodiments, the diode 104 may be a Schottky diode. Some embodiments provide that the diode 104 is a silicon Schottky diode. In some embodiments, the FET includes a high electron mobility transistor (HEMT) circuit that incorporates at least one heterojunction as a conducting channel. Some embodiments provide that the HEMT is a GaN HEMT.

In use and operation, some embodiments provide that responsive to a first half cycle of the AC input signal, the diode 104 is forward biased to cause an applied voltage at the source node 112 of the FET 102 and an applied voltage at the gate node 114 of the FET 102 to be slightly different. In this regard, the FET 102 may become saturated. Additionally, responsive to a second half cycle of the AC input signal, the diode 104 is reverse biased to cause the source node 112 of the FET 102 to float relative to the gate node 114 of the FET 102. Accordingly, the FET 102 may be reverse biased and thus may operate in a non-conducting mode. In this regard, the FET 102 may generate a rectified output signal through the rectified signal output node 110 during the first half cycle of the AC input signal and no output during the second half cycle of the AC input signal.

Figure 2:
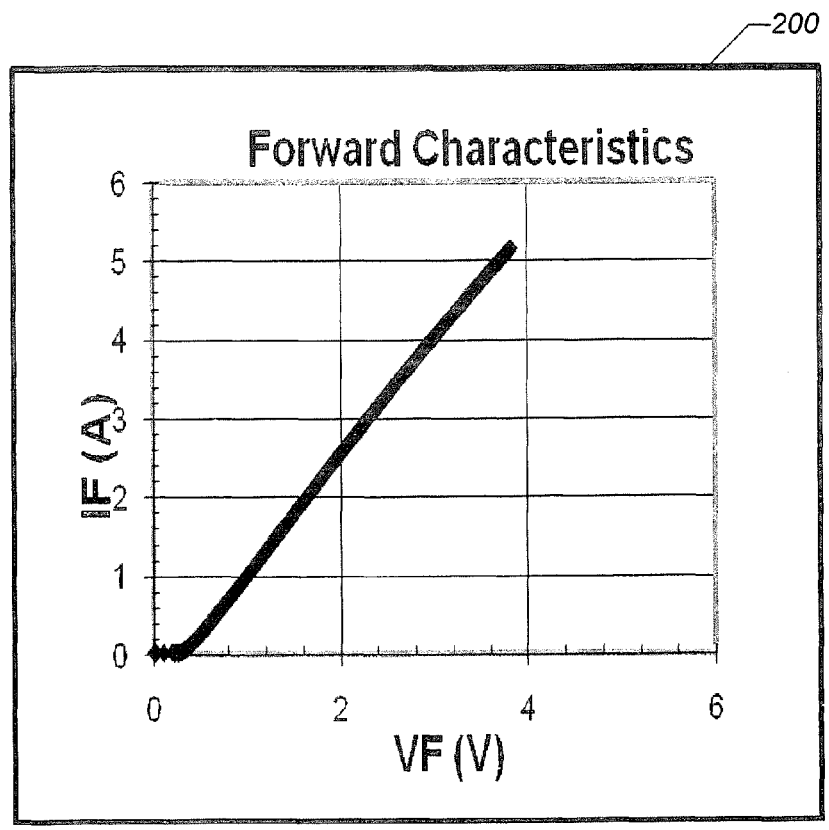
FIG. 2 is a graph illustrating a plot of static forward characteristics of a rectifier as described in FIG. 1.

Brief reference is now made to FIG. 2, which is a graph illustrating a plot of rectifier static forward characteristics of a rectifier circuit 100 as described in FIG. 1. As illustrated, the static characteristics of the rectifier circuit 100 in a forward biased (conducting) mode provide a substantially linear voltage-to-current correspondence once the applied voltage exceeds the voltage drop of the hot carrier semiconductor diode 104. As illustrated, the voltage drop of the hot carrier semiconductor diode 104 in an embodiment as tested was approximately 0.4V. Further, the slope of the voltage-current curve corresponds to the resistance between the source and drain nodes 112 and 113 of the depletion mode semiconductor 102 as tested.

Figure 3:
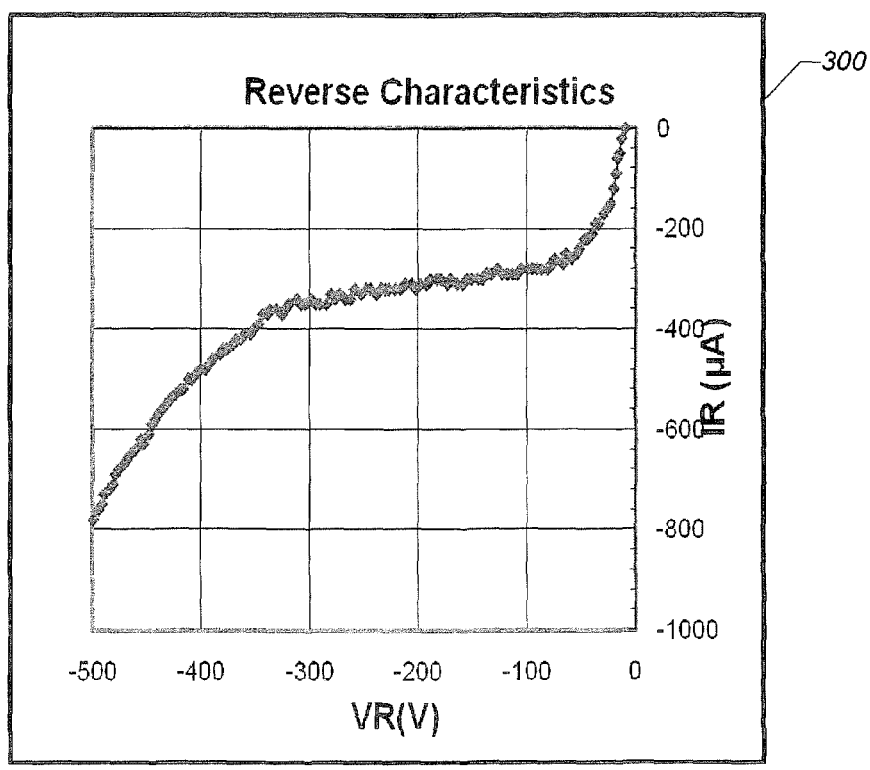
FIG. 3 is a graph illustrating a plot of reverse characteristics of a rectifier according to some embodiments of the present invention.

Brief reference is now made to FIG. 3, which is a graph illustrating a plot of reverse characteristics of a rectifier circuit 100 according to some embodiments of the present invention. The static characteristics of the rectifier circuit 100 in a reverse biased (non-conducting) mode illustrate a leakage current of up to approximately 800 μA at an applied reverse voltage of approximately 500V. Some embodiments provide that the leakage current may be attributed to the leakage current between the drain and gate nodes 113 and 114 of the depletion mode semiconductor 102.

The rectifier circuit 100 may include substantially non-linear capacitance characteristics with respect to reverse bias voltage. Some embodiments provide that the total capacitance of the rectifier circuit 100 is the series combination of the hot carrier semiconductor diode 104 and the drain to source capacitance of the depletion mode semiconductor 102. In this regard, the total capacitance may be expressed as:

$$CTotal = \frac{1}{\frac{1}{CDeplMode} + \frac{1}{CDIODE}};$$

where CDeplMode is the drain to source capacitance of the depletion mode semiconductor 102 and CDiode is the capacitance of the hot carrier semiconductor diode 104.

Figure 4:
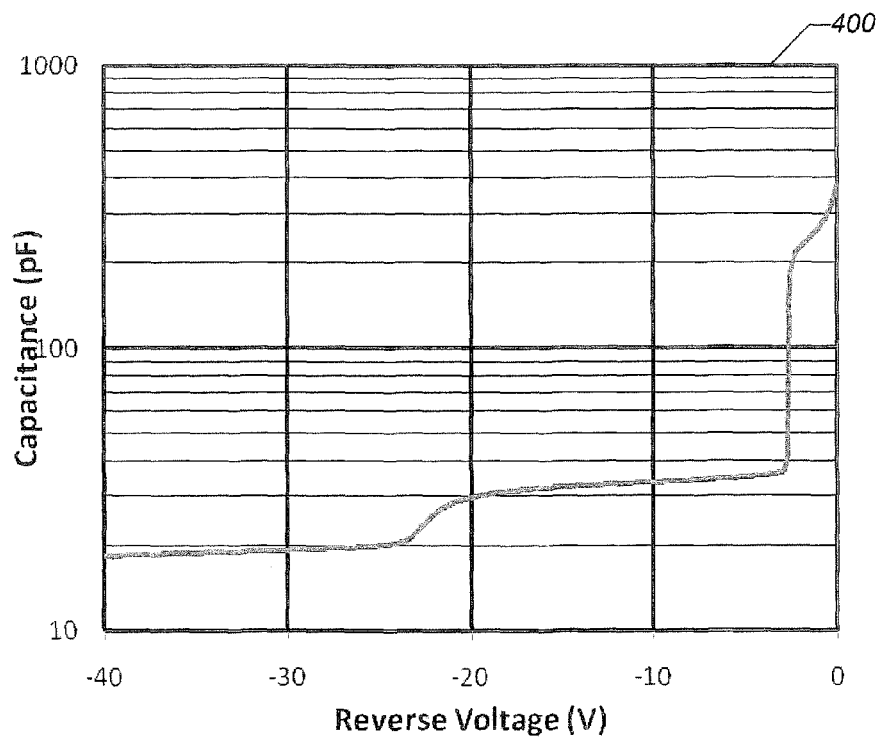
FIG. 4 is a graph illustrating a plot of reverse voltage capacitance characteristics of a rectifier according to some embodiments of the present invention.

By way of example, brief reference is made to FIG. 4, which is a graph illustrating a plot of reverse voltage capacitance characteristics of a rectifier circuit 100 according to some embodiments of the present invention. As illustrated, when the reverse voltage across the rectifier circuit 100 is less than the threshold voltage of the depletion mode semiconductor 102, the depletion mode semiconductor 102 is conducting and the total capacitance of the rectifier circuit 100 may be dominated by the reverse bias capacitance of the hot carrier semiconductor diode 104. When the reverse voltage across the rectifier circuit 100 exceeds the threshold voltage of the depletion mode semiconductor 102, depletion mode semiconductor 102 is in a non-conducting mode and the total capacitance of the rectifier circuit 100 is the series combination of the output capacitance of the depletion mode semiconductor 102 and the reverse capacitance of the hot carrier semiconductor diode 104. Accordingly, as illustrated, the capacitance of the rectifier circuit 100 drops significantly when the reverse bias exceeds the depletion mode semiconductor threshold, which may be approximately 2.5 V according to some embodiments. By providing low reverse voltage capacitance, the rectifier circuit 100 may provide increased switching speeds.

Figure 5:
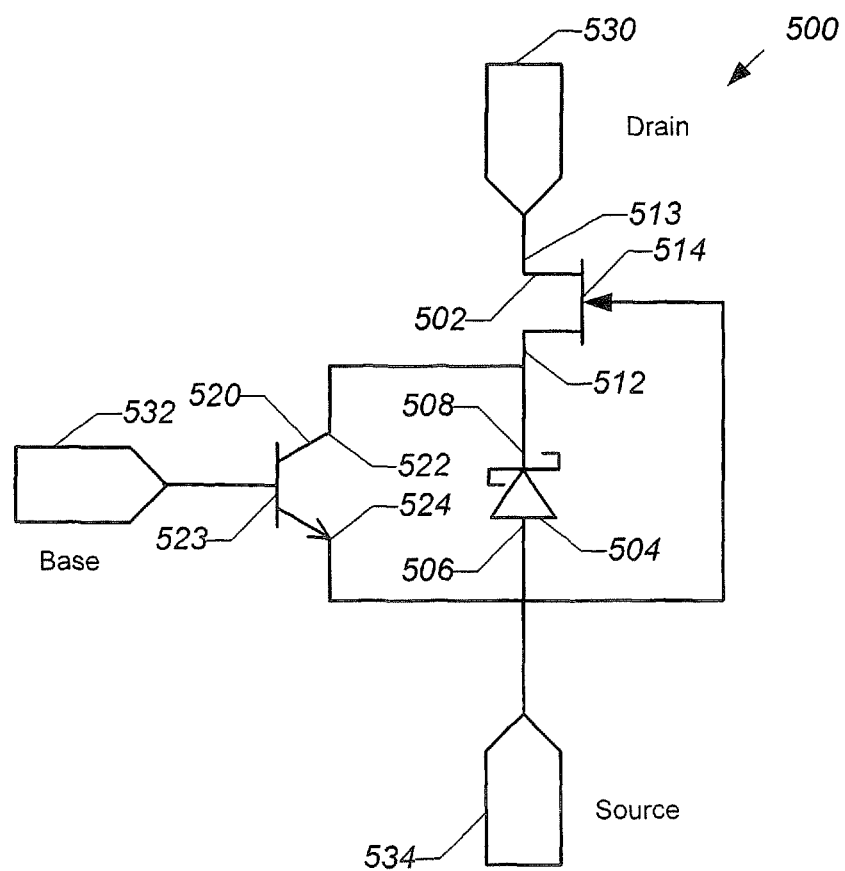
FIG. 5 is a schematic diagram of a reverse conducting cascode switch in accordance with some embodiments of the present invention.

In some embodiments, the rectifier circuit 100 described herein may be supplemented by a low-voltage high-speed switching device to provide a reverse conducting characteristic. For example, reference is now made to FIG. 5, which is a schematic diagram of a reverse conducting cascode switch in accordance with some embodiments of the present invention. The reverse conducting switch 500 includes a depletion mode semiconductor 502 having a drain node 513 that is connected to a drain node 530 of the reverse conducting switch 500. A hot carrier semiconductor diode 504 includes a cathode 508 that is connected to a source node 512 of the depletion mode semiconductor 502. Some embodiments provide that the hot carrier semiconductor diode 504 also includes an anode 506 that is connected to a gate node 514 of the depletion mode semiconductor 502. A reverse conducting switch 500 may include a source node 534 that is connected to the anode 506 of the hot carrier semiconductor diode 504 and the gate node 514 of the depletion mode semiconductor 502.

In some embodiments, a reversing transistor 520 may be provided that may include a collector node 522 connected to the cathode 508 of the hot carrier semiconductor diode 504 and the source node 512 of the depletion mode semiconductor 502. An emitter node 524 of the reversing transistor 520 may be connected to the source node 534 of the reverse conducting switch 500, the anode 506 of the hot carrier semiconductor diode 504 and the gate node 514 of the depletion mode semiconductor 502.

In some embodiments, the reversing transistor 520 may include any low voltage, high speed, normally off switch. For example, the may include Silicon MOSFET, DMOS, etc., high speed bipolar junction transistor, such as, for example, silicon-germanium (SiGe) heterojunction bipolar transistors, SiC bipolar transistors, and/or GaAs HBT (heterojunction bipolar transistor), among others.

In some embodiments, the reversing transistor 520 may include a base node 523 that is connected to a base node 532 of the reverse conducting switch 500. In this manner, the base node 523 may receive a signal causing the reversing transistor 520 to conduct from the source node 512 to the gate node 514 of the depletion mode semiconductor 502, which causes the depletion mode semiconductor 502 to become conductive from the source terminal 512 to the drain terminal 513. In this manner, a reverse conducting switch 500 may be provided that may selectively conduct from the drain node 530 to the source node 534.

In some embodiments, the reversing transistor 520 and a matching hot carrier semiconductor diode 504, for example, could be integrated in a larger chip that contains the gate driver circuits. Some embodiments provide that the depletion mode semiconductor 502 of the switch 500 could be also be integrated into the chip and/or may a separate component.

Although not illustrated herein, multiple ones of the rectifier circuits and/or reverse conducting switches described herein may be used in combination with one another to provide full wave rectifiers and/or rectifiers capable of receiving and/or rectifying polyphase AC input signals.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:
1. A rectifier circuit comprising:
   a depletion mode semiconductor having an output connected to a rectified signal output node of the rectifier circuit;

a hot carrier semiconductor diode having a cathode connected to a source node of the depletion mode semiconductor and an anode connected to a gate node of the depletion mode semiconductor; and an alternating current (AC) input node that is connected to the anode of the hot carrier semiconductor diode and the gate node of the depletion mode semiconductor and that is configured to receive an AC input signal, wherein when a first half cycle of the AC input signal is applied to the AC input node, a voltage drop between the AC input node and the rectified signal output node comprises a sum of a diode forward biased voltage drop and a voltage drop due to a source to drain resistance of the depletion mode semiconductor.

2. The rectifier circuit according to claim 1, wherein responsive to a first half cycle of the AC input signal, the hot carrier semiconductor diode is forward biased to cause an applied voltage at the source node of the depletion mode semiconductor and an applied voltage at the gate node of the depletion mode semiconductor to be slightly different, which forward biases the depletion mode semiconductor, and wherein responsive to a second half cycle of the AC input signal, the hot carrier semiconductor diode is reverse biased to cause the source node of the depletion mode semiconductor to float relative to the gate node of the depletion mode semiconductor, which reverse biases the depletion mode semiconductor when the depletion mode semiconductor generates a rectified output signal through the rectified signal output node during at least the first half cycle of the AC input signal.

3. The rectifier circuit according to claim 1, wherein the hot carrier semiconductor diode comprises a Schottky diode.

4. The rectifier circuit according to claim 1, wherein the depletion mode semiconductor comprises a high electron mobility transistor (HEMT) that incorporates at least one heterojunction as a conducting channel.

5. The rectifier circuit according to claim 1, wherein the hot carrier semiconductor diode comprises a silicon Schottky diode.

6. The rectifier circuit according to claim 1, wherein the hot carrier semiconductor diode comprises a silicon Schottky diode, and the depletion mode semiconductor comprises a GaN high electron mobility transistor (HEMT).

7. A high-voltage, low-capacitance rectifier circuit, the rectifier circuit comprising:

a high-speed, high-voltage, normally-on field effect transistor (FET) connected to a rectified signal output node of the rectifier circuit; and a high-speed, low-voltage diode having a cathode connected to a source node of the FET and an anode connected to both of a gate node of the FET and an alternating current (AC) input node that is operable to receive an AC input signal, wherein when a first half cycle of the AC input signal is applied to the AC input node, a voltage drop between the AC input node and the rectified signal output node comprises a sum of a diode forward biased voltage drop and a voltage drop due to a source to drain resistance of the FET.

8. The rectifier circuit according to claim 7, wherein responsive to a first half cycle of the AC input signal, the diode is forward biased to cause an applied voltage at the source node of the FET and an applied voltage at the gate node of the FET to be slightly different, which causes the FET to saturate, and wherein responsive to a second half cycle of the AC input signal, the diode is reverse biased to cause the source node of the FET to float relative to the gate node of the FET, which reverse biases the FET to cause the FET to generate a rectified output signal through the rectified signal output node during at least the first half cycle of the AC input signal.

9. The rectifier circuit according to claim 7, wherein the diode comprises a Schottky diode.

10. The rectifier circuit according to claim 7, wherein the FET comprises a high electron mobility transistor (HEMT) that incorporates at least one heterojunction as a conducting channel.

11. The rectifier circuit according to claim 7, wherein the diode comprises a silicon Schottky diode, and the FET comprises a GaN high electron mobility transistor (HEMT) formed on a SiC substrate.

12. The rectifier circuit according to claim 7, wherein a diode forward biased voltage drop is about 0.4V.

13. The rectifier circuit according to claim 7, wherein a voltage to current correspondence of the rectifier circuit is substantially linear responsive to an applied voltage exceeding a diode forward biased voltage drop.

14. A high-voltage, low-capacitance rectifier circuit, the rectifier circuit comprising:

a high-speed, high-voltage, normally-on field effect transistor (FET) connected to a rectified signal output node of the rectifier circuit, wherein the FET comprises a GaN high electron mobility transistor (HEMT) formed on a SiC substrate; and a high-speed, low-voltage diode having a cathode connected to a source node of the FET and an anode connected to both of a gate node of the FET and an alternating current (AC) input node that is operable to receive an AC input signal, wherein the diode comprises a silicon Schottky diode, and wherein when a first half cycle of the AC input signal is applied to the AC input node, a voltage drop between the AC input node and the rectified signal output node comprises a sum of a Schottky diode forward biased voltage drop and a voltage drop due to a source to drain resistance of the GaN HEMT.

15. A rectifier circuit comprising:

a depletion mode semiconductor having an output connected to a rectified signal output node of the rectifier circuit;

a hot carrier semiconductor diode having a cathode connected to a source node of the depletion mode semiconductor and an anode connected to a gate node of the depletion mode semiconductor; and an alternating current (AC) input node that is connected to the anode of the hot carrier semiconductor diode and the gate node of the depletion mode semiconductor and that is configured to receive an AC input signal, wherein the depletion mode semiconductor comprises a GaN high electron mobility transistor (HEMT) formed on a SiC substrate, and wherein responsive to a second half cycle of the AC input signal, the hot carrier semiconductor diode is reverse biased to cause the source node of the depletion mode semiconductor to float relative to the gate node of the depletion mode semiconductor, which reverse biases the depletion mode semiconductor when the depletion mode semiconductor generates a rectified output signal through the rectified signal output node during at least the first half cycle of the AC input signal.

16. A high-voltage, low-capacitance rectifier circuit, the rectifier circuit comprising:
- a high-speed, high-voltage, normally-on field effect transistor (FET) connected to a rectified signal output node of the rectifier circuit; and
- a high-speed, low-voltage diode having a cathode connected to a source node of the FET and an anode connected to both of a gate node of the FET and an alternating current (AC) input node that is operable to receive an AC input signal,
- wherein the FET comprises a GaN high electron mobility transistor (HEMT) formed on a SiC substrate, and
- wherein responsive to a second half cycle of the AC input signal, the diode is reverse biased to cause the source node of the FET to float relative to the gate node of the FET, which reverse biases the FET to cause the FET to generate a rectified output signal through the rectified signal output node during at least the first half cycle of the AC input signal.

* * * * *